United States Patent
Fujita et al.

(10) Patent No.: US 10,153,206 B2
(45) Date of Patent: Dec. 11, 2018

(54) DICING METHOD AND LASER PROCESSING APPARATUS

(71) Applicant: Toshiba Memory Corporation, Tokyo (JP)

(72) Inventors: Tsutomu Fujita, Yokkaichi Mie (JP); Takanobu Ono, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,984

(22) Filed: Sep. 4, 2017

(65) Prior Publication Data

US 2018/0277435 A1 Sep. 27, 2018

(30) Foreign Application Priority Data

Mar. 23, 2017 (JP) ................. 2017-057716

(51) Int. Cl.
| | |
|---|---|
| *H01L 21/78* | (2006.01) |
| *H01L 21/268* | (2006.01) |
| *H01L 21/66* | (2006.01) |
| *H01L 21/67* | (2006.01) |
| *B23K 26/03* | (2006.01) |
| *B23K 26/08* | (2014.01) |
| *B23K 26/364* | (2014.01) |
| *H01L 21/683* | (2006.01) |

(52) U.S. Cl.
CPC ............ *H01L 21/78* (2013.01); *B23K 26/032* (2013.01); *B23K 26/0884* (2013.01); *B23K 26/364* (2015.10); *H01L 21/268* (2013.01); *H01L 21/67092* (2013.01); *H01L 21/67259* (2013.01); *H01L 22/20* (2013.01); *H01L 21/6836* (2013.01); *H01L 2221/68327* (2013.01)

(58) Field of Classification Search
None
See application file for complete search history.

(56) References Cited

U.S. PATENT DOCUMENTS

| | | | |
|---|---|---|---|
| 7,791,001 | B2 | 9/2010 | Nishiwaki et al. |
| 8,610,028 | B2 | 12/2013 | Kuno et al. |
| (Continued) | | | |

FOREIGN PATENT DOCUMENTS

| | | |
|---|---|---|
| JP | 2006-145810 A | 6/2006 |
| JP | 2008-087027 A | 4/2008 |
| (Continued) | | |

*Primary Examiner* — Asok K Sarkar
(74) *Attorney, Agent, or Firm* — Patterson & Sheridan, LLP

(57) ABSTRACT

According to one embodiment, a dicing method is provided. The dicing method includes detecting a first distance between a first portion of a substrate and a first substrate information detection unit. The method also includes detecting a second distance between a second portion of the substrate a second substrate information detection unit, the second portion different from the first portion. Distance information is calculated between the substrate and a processing lens, which is located farther from the second substrate information detection unit than from the first substrate information detection unit, based on the detected first distance and the detected second distance, and he substrate is irradiated with laser light from the processing lens based on the distance information.

12 Claims, 4 Drawing Sheets

(56) References Cited

U.S. PATENT DOCUMENTS

2009/0197351 A1\* 8/2009 Morikazu .............. B23K 26/03
                                                                                 438/5
2009/0203103 A1\* 8/2009 Pierce ...................... C12N 1/20
                                                                                  435/178

FOREIGN PATENT DOCUMENTS

| JP | 2009-140958 A | 6/2009 |
| JP | 2009-140959 A | 6/2009 |
| JP | 5101073 B2 | 12/2012 |
| JP | 5213112 B2 | 6/2013 |
| JP | 5420890 B2 | 2/2014 |

\* cited by examiner $$h(x) = i(x) + i(x-L) - j(x-L)$$

DICING METHOD AND LASER PROCESSING APPARATUS

CROSS-REFERENCE TO RELATED APPLICATION

This application is based upon and claims the benefit of priority from Japanese Patent Application No. 2017-057716, filed Mar. 23, 2017, the entire contents of which are incorporated herein by reference.

FIELD

Embodiments described herein relate generally to a dicing method and a laser processing apparatus.

BACKGROUND

A known dicing method for dividing a substrate having semiconductor devices formed thereon into individual chips includes stealth processing which irradiates a substrate with laser light via a processing lens. In this stealth processing, it is difficult to accurately measure a distance between the processing lens and the substrate.

DETAILED DESCRIPTION

Embodiments provide a dicing method and a laser processing apparatus each of which is capable of increasing accuracy in the measurement of a distance between a processing lens and a substrate.

In general, according to one embodiment, a dicing method is provided. The dicing method includes detecting a first distance between a first portion of a substrate and a first substrate information detection unit. The method also includes detecting a second distance between a second portion of the substrate a second substrate information detection unit, the second portion different from the first portion. Distance information is calculated between the substrate and a processing lens, which is located farther from the second substrate information detection unit than from the first substrate information detection unit, based on the detected first distance and the detected second distance, and he substrate is irradiated with laser light from the processing lens based on the distance information.

Hereinafter, an embodiment of the present disclosure is described with reference to the drawings. The present embodiment should not be construed to limit the present disclosure.

Figure 1:
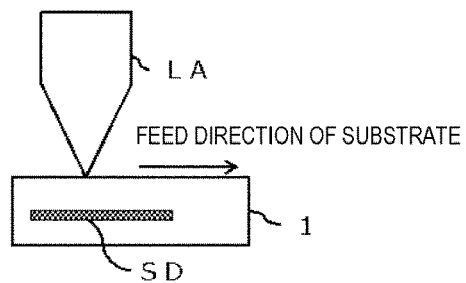
FIG. 1 is a sectional view illustrating a dicing method according to an embodiment.

FIG. 1 illustrates an example of a dicing method according to the present embodiment.

The dicing method irradiates a substrate 1, the front surface of which is covered with a protective film or tape (not illustrated), with laser light LA. The protective tape is provided to protect a semiconductor device formed on the front surface of the substrate 1. The substrate 1 is, for example, a silicon substrate. FIG. 1 is a sectional view of the substrate 1 in the process of laser irradiation.

The dicing method irradiates the substrate 1 with laser light along an intended dicing line thereon in such a way as to converge the laser light at the inside of the substrate 1, thus forming a modified layer SD, in which crystal orientations are disordered, inside the substrate 1. With the modified layer SD serving as a starting point, a crack extending to the upper and lower sides of the substrate 1 occurs.

Then, the dicing method polishes the rear surface of the substrate 1 with a grinding stone, so that a cut line appears on the surface.

After that, the dicing method fixes an adhesive-backed tape, such as a die attached film (DAF), to the substrate 1 with a sticking ring and, then, peels off the protective tape from the substrate 1. Then, the dicing method thrusts up the substrate 1 with an expanding ring, thus dividing the substrate 1 into individual chips.

Figure 2:
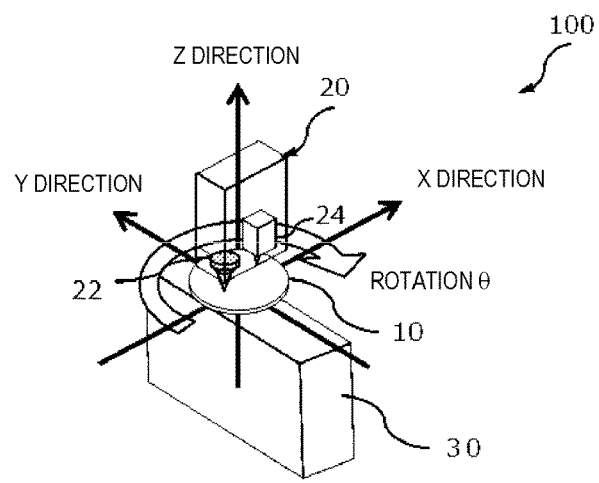
FIG. 2 illustrates a laser processing apparatus according to the embodiment.

In such laser light irradiation, the dicing method uses a laser processing apparatus 100 such as that illustrated in FIG. 2. The laser processing apparatus 100 includes a chuck table 10, on which the substrate 1 is allowed to be placed thereon, a stealth dicing (SD) engine 20, and a substrate moving unit 30 capable of moving the substrate 1. The SD engine 20 has a laser light irradiation function. Details of the SD engine 20 are described below. The chuck table 10 is circular, and, on a plane parallel to the surface of the chuck table 10, an X direction and a Y direction perpendicular the X direction are defined. Furthermore, a direction perpendicular to both the X direction and the Y direction is defined as a Z direction. The Z direction is a direction perpendicular to the surface (X-Y plane) of the chuck table 10. Moreover, in the X-Y plane, an angle of rotation around a center point of the chuck table 10 is denoted by θ.

Moving the chuck table 10 with the substrate moving unit 30 enables changing the irradiation position of laser light on the substrate 1.

Figure 3:
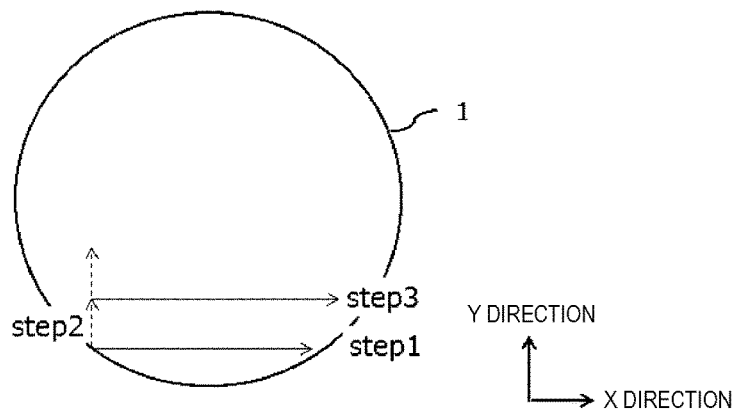
FIG. 3 is a diagram illustrating directions of movement of a substrate according to the embodiment.

Usually, during laser light irradiation, a substrate moves in one direction along the X direction and the Y direction. This direction of movement of the substrate during laser light irradiation is referred to as a "feed direction of the substrate". As illustrate in FIG. 3, the dicing method irradiates the substrate 1 with laser light while moving the substrate 1 in the X direction (Step1), and, after that, rotates the substrate 1. The angle of this rotation is θ=90°. Then, the dicing method moves the substrate 1 a predetermined distance in the Y direction (Step2). The predetermined distance is, for example, the length of one chip when the substrate 1 is divided into individual chips. While moving the substrate 1 in the Y direction at this time, the dicing method does not perform laser light irradiation. Then, the dicing method irradiates the substrate 1 with laser light along the X direction while moving the substrate 1 in the X direction again (Step3). The dicing method repeats the movement in the X direction and the laser light irradiation and the movement in the Y direction in the above-described way, thus performing laser light irradiation in the X direction over the entire surface of the substrate 1.

Next, the dicing method switches the X direction and Y direction of the substrate 1 over to each other. The dicing method repeats the movement along the Y direction and the laser light irradiation and the movement in the X direction. While moving the substrate 1 in the X direction at this time, the dicing method does not perform laser light irradiation. In this way, the substrate 1 is irradiated with laser light in a lattice pattern in such a way as to match the size of each individual chip along the X direction and Y direction of the substrate 1, so that a modified layer SD is formed inside the substrate 1. After that, the dicing method divides the substrate 1 into individual chips according to a known method.

Figure 4:
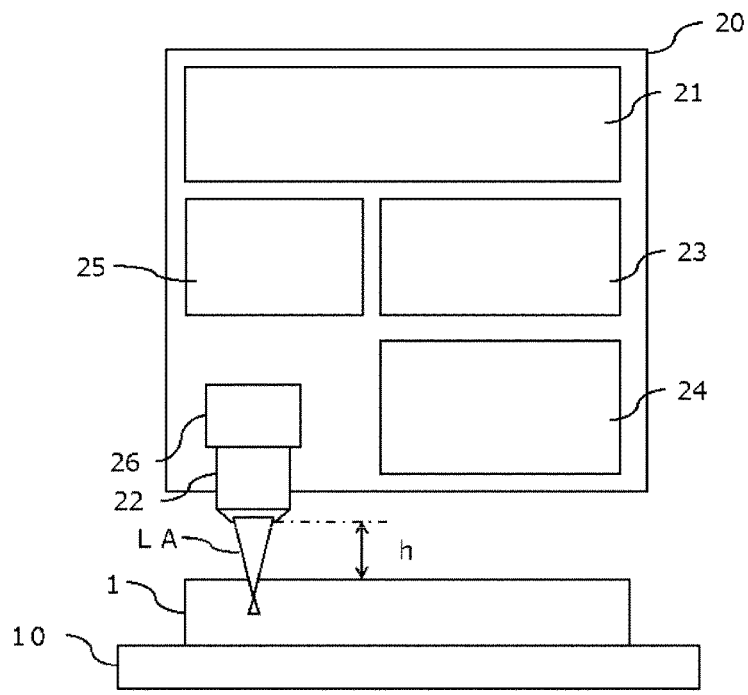
FIG. 4 is a diagram illustrating the dicing method according to the embodiment.
Figure 5:
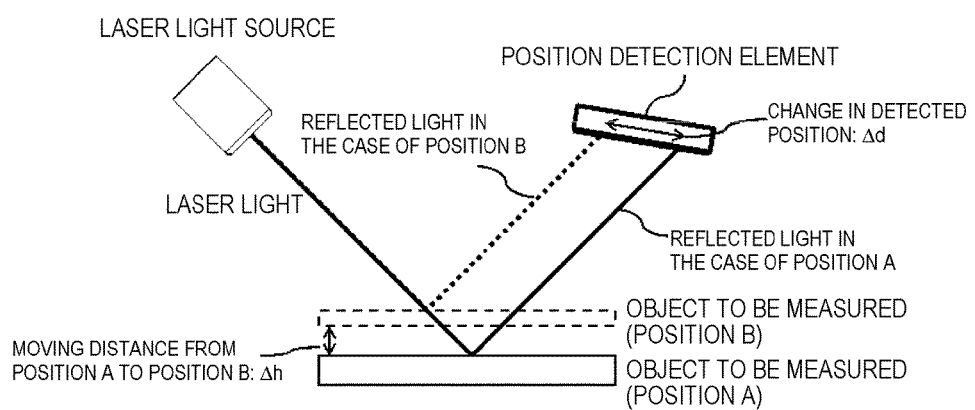
FIG. 5 is a diagram illustrating a reflection system according to the embodiment.

Laser light irradiation using the SD engine 20 is described with reference to FIG. 4. The SD engine 20 includes a processing laser light source 21, which is used for processing a substrate, a processing lens 22, which is used to irradiate the substrate with laser light, a charge-coupled device (CCD) camera 23, which is used to confirm the positions of the substrate in the X direction and Y direction, and a substrate information detection unit 24, which is used to confirm the position of the substrate in the Z direction. The CCD camera 23 is able to detect the positions of the substrate in the X direction and Y direction by irradiating the substrate with white light WL through the processing lens 22. The SD engine 20 further includes a calculation unit 25, which calculates distance information between the substrate 1 and the processing lens 22 based on information obtained by the substrate information detection unit 24. The distance between mutually opposite surfaces of the substrate 1 and the processing lens 22 is referred to as a "distance h between the substrate 1 and the processing lens 22". Furthermore, the distance information can be obtained by, for example, a reflection system. The reflection system is configured with, for example, a laser light source and a position detection element as illustrated in FIG. 5. The reflection system irradiates an object to be measured with laser light and causes the position detection element to detect light reflected from the object to be measured. For example, as the object to be measured moves from a position A to a position B, the track of the reflected light changes. The reflection system uses a method of detecting a moving distance Δh of the object to be measured based on a change of position Δd detected by the position detection element. The processing lens 22 is equipped with a piezoelectric element 26, and the position of the processing lens 22 in the Z direction is able to be changed by the piezoelectric element 26. Thus, the SD engine 20 has an auto focus (AF) function which moves the processing lens 22 according to the distance h between the substrate 1 and the processing lens 22.

Figure 6:
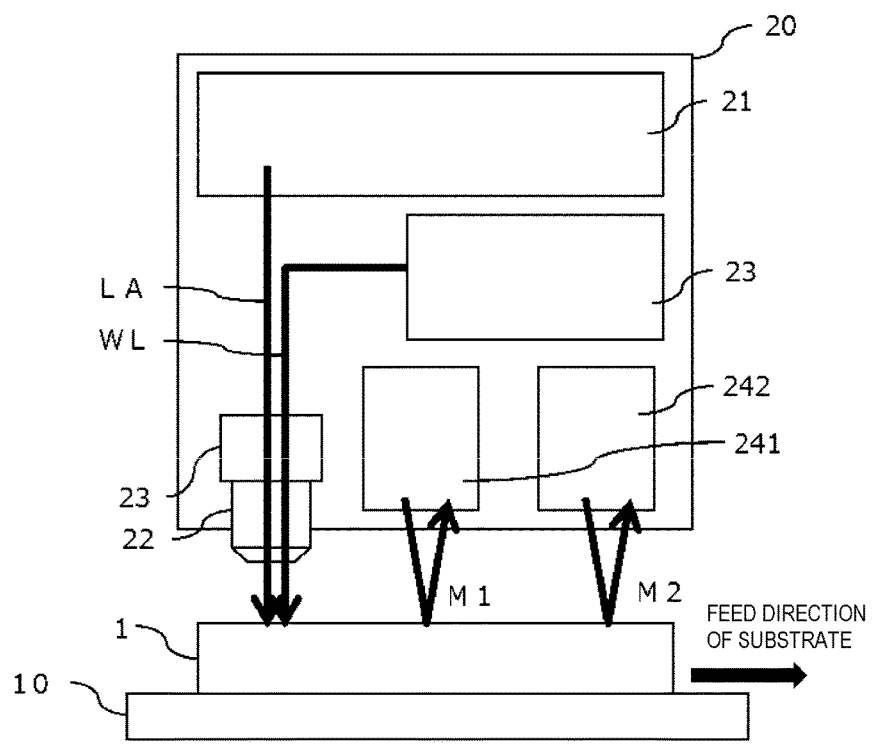
FIG. 6 is a diagram illustrating the dicing method according to the embodiment.

In the present embodiment, the substrate information detection unit 24 includes a plurality of substrate information detection units. In FIG. 6, a first substrate information detection unit 241 and a second substrate information detection unit 242 are illustrated. In one embodiment, the first substrate information detection unit 241 and a second substrate information detection unit 242 are each an optical detector including a light source which irradiates the substrate and a photodetector which detects the reflected light. In FIG. 6, for the sake of simplification, the calculation unit 25 is omitted from illustration. The processing lens 22, the first substrate information detection unit 241, and the second substrate information detection unit 242 are arranged side by side at regular intervals along the feed direction of the substrate. In other words, the distance from the processing lens 22 to the first substrate information detection unit 241 is equal to the distance from the first substrate information detection unit 241 to the second substrate information detection unit 242 in the feed direction of the substrate. In more accurate words, positions in which laser light LA passing through the processing lens 22, light M1 passing through the first substrate information detection unit 241, and light M2 passing through the second substrate information detection unit 242 respectively arrive at the substrate 1, are located at regular intervals. For example, the distance from the processing lens 22 to the first substrate information detection unit 241 is one-half the distance from the processing lens 22 to the second substrate information detection unit 242 in the feed direction of the substrate. Furthermore, the first substrate information detection unit 241 and the second substrate information detection unit 242 are able to concurrently confirm the position of the substrate 1 in the Z direction.

Since the substrate information detection unit 24 includes a plurality of substrate information detection units, the SD engine 20 is able to accurately measure the distance h between the processing lens 22 and the substrate 1. The reason for this is as follows.

In order to reduce a variation in convergence of laser light in the thickness direction of the substrate 1 during laser light irradiation, it is significant to keep the distance h between the processing lens 22 and the substrate 1 constant. Therefore, there is a method of measuring substrate information in front of the processing lens 22 in the feed direction of the substrate, adjusting the position of the processing lens 22 in the Z direction based on a result of the measurement, and performing laser light irradiation.

In this case, while it is desirable that the substrate be fed parallel with the X-Y plane, the feed direction of the substrate may move out of alignment relative to the X-Y plane. In other words, the substrate may not move in parallel with the X-Y plane and thus may sway in the Z direction. Thus, a laser light irradiation axis may lack straightness and may have an undulation component. Such an undulation component may disadvantageously result in determining the position of the processing lens in the Z direction based on substrate information different from the actual laser light irradiation position.

Figure 7:
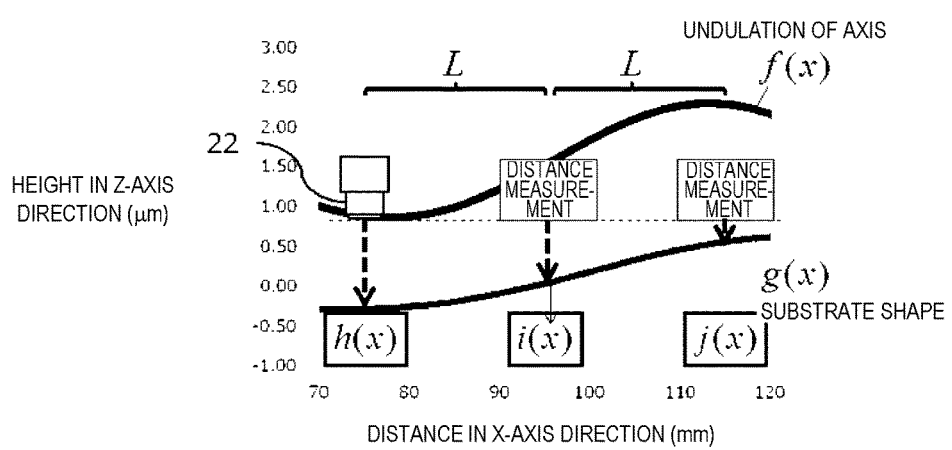
FIG. 7 is a conceptual diagram illustrating a measurement method according to the embodiment.

FIG. 7 is a conceptual diagram illustrating a measurement method according to the present embodiment. While a case where the feed direction of the substrate is the X direction is illustrated, the same applies to a case where the feed direction is the Y direction. FIG. 7 illustrates an undulation component f(x) of the axis and an actual substrate shape g(x) relative to the position of the substrate in the X direction. The distance h(x) between the processing lens 22 and the substrate 1 is expressed by the following formula (1).

$$h(x)=f(x)-g(x) \quad (1)$$

Moreover, respective pieces of substrate information i(x) and j(x) in a first portion and a second portion of a substrate, respectively, about which the substrate information is measured are expressed by the following formula (2) and formula (3), respectively.

$$i(x)=f(x)-g(x+L) \quad (2)$$

$$j(x)=f(x)-g(x+2L) \quad (3)$$

In the above formulae, the first portion and the second portion of the substrate are distances of L and 2L away from the position of the processing lens 22, respectively, and correspond to the first substrate information detection unit 241 and the second substrate information detection unit 242 illustrated in FIG. 6, respectively. L is, for example, 70 mm.

From formulae (1), (2), and (3), the following formula (4) is obtained.

$$h(x)=f(x)-g(x+L)+g(x+L)-g(x)=i(x)+g(x+L)-g(x)=i(x)+i(x-L)-j(x-L) \quad (4)$$

Figure 8:
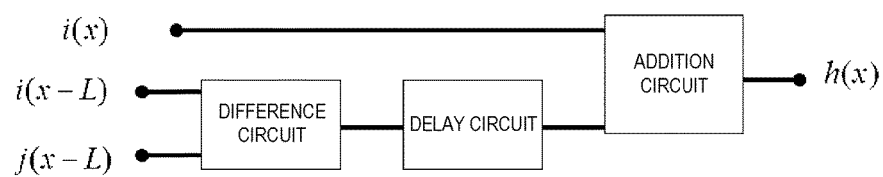
FIG. 8 is a conceptual diagram illustrating the measurement method according to the embodiment.

Each term of the right-hand side of formula (4) can be obtained by measurement. For example, as illustrated in FIG. 8, the distance h(x) can be obtained from signals corresponding to the pieces of substrate information i(x) and j (x) in the first portion and the second portion of the substrate by using a difference circuit, a delay circuit, and an addition circuit. Therefore, in this way, acquiring pieces of substrate information i(x) and j(x) in two portions of the substrate enables determining the distance h(x) between the processing lens 22 and the substrate 1 with the undulation component f(x) removed.

The dicing method determines the position of the processing lens in the Z direction based on the distance h(x) between the processing lens and the substrate. For example, the dicing method changes the position of the processing lens in the Z direction by a voltage that is applied to the piezoelectric element 26. Constantly moving the processing lens up and down using the piezoelectric element 26 enables shortening a time required until the distance information is reflected in the position of the processing lens. After that, the dicing method irradiates the substrate with laser light from the processing lens. The dicing method repeats the calculation of the distance information and the laser light irradiation while changing the position of the substrate along the feed direction of the substrate, thus performing dicing of the substrate.

Alternatively, after calculating distance information in a predetermined length by repeating detection of substrate information and calculation of distance information, the dicing method cam perform laser light irradiation over the predetermined length.

In this way, according to the present embodiment, a distance between the processing lens and the substrate can be obtained without being affected by an undulation component. In other words, a change in measured value of distance information occurring due to a change in position of a measuring device can be reduced. Since the processing lens can be adjusted to a position in the Z direction associated with the actual state of the substrate, a variation in converging position of laser light becomes small, and SD layers can be formed uniformly in the thickness direction of the substrate.

While, here, two substrate information detection units are illustrated, a plurality of substrate information detection units can be provided.

Figure 9:
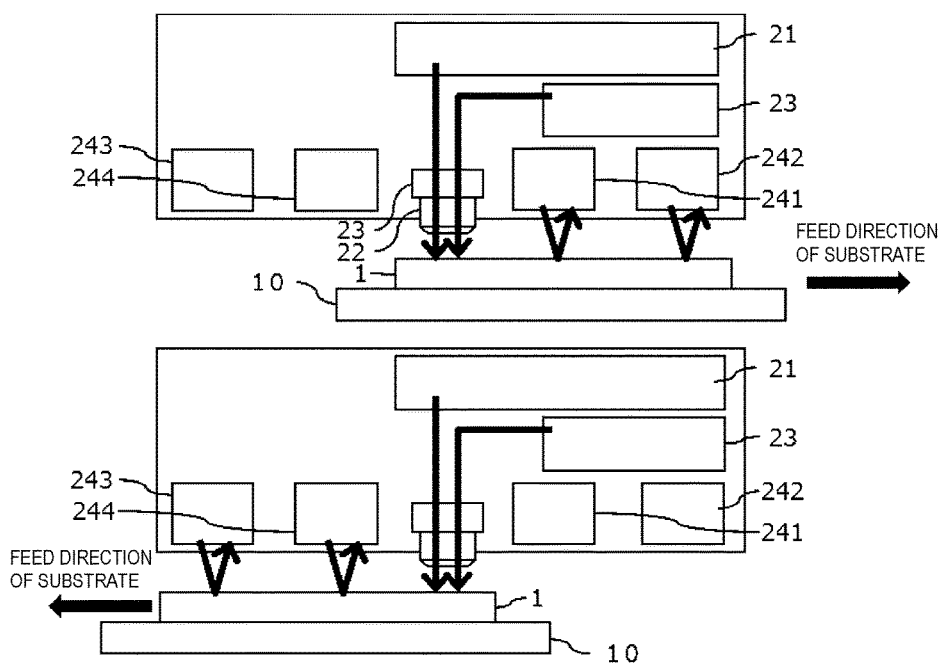
FIG. 9 is a diagram illustrating a dicing method according to a modification example of the embodiment.

FIG. 9 illustrates a modification example of the present embodiment. In the case of FIG. 6, the first substrate information detection unit 241 and the second substrate information detection unit 242 are arranged only in one direction relative to the processing lens along the feed direction of the substrate. On the other hand, in case of the modification example illustrated in FIG. 9, a plurality of substrate information detection units, similar to the substrate information detection unit 24, are arranged on both sides of the processing lens along the feed direction of the substrate. More specifically, a third substrate information detection unit 243, a fourth substrate information detection unit 244, the processing lens 22, the first substrate information detection unit 241, and the second substrate information detection unit 242 are sequentially arranged side by side along the feed direction of the substrate. Arranging the substrate information detection units in both directions relative to the processing lens in the above-described way enables accurately obtaining the distance between the processing lens and the substrate regardless of the direction of substrate processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A dicing method comprising:
   detecting a first distance between a first portion of a substrate and a first substrate information detection unit;
   detecting a second distance between a second portion of the substrate and a second substrate information detection unit, the second portion being different from the first portion;
   calculating distance information between the substrate and a processing lens, which is located farther from the second substrate information detection unit than from the first substrate information detection unit, based on the detected first distance and the detected second distance; and
   irradiating the substrate with laser light from the processing lens based on the distance information.

2. The dicing method according to claim 1, wherein a distance from a position in which the laser light passing through the processing lens arrives at the substrate to the first portion is equal to a distance from the first portion to the second portion.

3. The dicing method according to claim 2, further comprising repeating detecting the first distance, detecting the second distance, calculating the distance information, and irradiating the substrate with the laser light a plurality of times.

4. The dicing method according to claim 1, further comprising, repeating detecting the first distance, detecting the second distance, calculating the distance information, and irradiating the substrate with the laser light.

5. The dicing method according to claim 1, further comprising adjusting a position of the processing lens based on the distance information.

6. The dicing method according to claim 1, wherein the processing lens is equipped with a piezoelectric element, and
   wherein the dicing method further comprises changing a voltage that is applied to the piezoelectric element based on the distance information.

7. The dicing method according to claim 1, further comprising concurrently detecting the first distance and the second distance.

8. The dicing method according to claim 1, wherein the first distance is detected in a third portion of the substrate and the second distance is detected in a fourth portion of the substrate, wherein the third portion is different than the fourth portion.

9. The dicing method according to claim 1, wherein the first distance and the second distance are detected on opposing sides of the processing lens.

10. The dicing method according to claim 9, wherein the first distance and the second distance are detected along a feed direction of the substrate.

11. The dicing method according to claim 1, wherein the first distance and the second distance are detected along a feed direction of the substrate during relative movement of the substrate and the processing lens.

12. The dicing method according to claim 11, wherein the first distance and the second distance are detected on opposing sides of the processing lens.

* * * * *